(12) United States Patent
Mayer et al.

(10) Patent No.: US 7,560,016 B1
(45) Date of Patent: Jul. 14, 2009

(54) SELECTIVELY ACCELERATED PLATING OF METAL FEATURES

(75) Inventors: Steven T. Mayer, Lake Oswego, OR (US); John Stephen Drewery, Alameda, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 12/291,277

(22) Filed: Nov. 7, 2008

Related U.S. Application Data

(60) Division of application No. 10/947,085, filed on Sep. 21, 2004, now Pat. No. 7,449,099, which is a continuation-in-part of application No. 10/824,069, filed on Apr. 13, 2004, now Pat. No. 7,405,163.

(51) Int. Cl.
  *C25D 5/02* (2006.01)
(52) U.S. Cl. ............................ 205/122; 205/80; 205/96; 205/123; 205/157; 205/298; 438/618; 438/620; 438/669; 438/672; 438/685; 438/686; 438/687; 427/123; 427/124; 427/125; 427/435; 427/436; 427/443.1; 427/443.2
(58) Field of Classification Search ................. 205/122, 205/80, 96, 123, 157, 298; 438/618, 620, 438/669, 672, 685, 686, 687; 427/123, 124, 427/125, 435, 436, 443.1, 443.2
See application file for complete search history.

(56) References Cited

U.S. PATENT DOCUMENTS

| | | | | |
|---|---|---|---|---|
| 4,564,424 A * | 1/1986 | Cassat et al. | ................ | 428/626 |
| 5,017,503 A * | 5/1991 | Shiba | ......................... | 438/330 |
| 5,158,860 A * | 10/1992 | Gulla et al. | .................. | 430/315 |
| 5,665,200 A * | 9/1997 | Fujimoto et al. | ............. | 438/694 |
| 6,440,781 B1 * | 8/2002 | Coppock et al. | ............. | 438/131 |
| 6,534,116 B2 * | 3/2003 | Basol | ......................... | 438/667 |
| 6,684,499 B2 * | 2/2004 | Romano et al. | ................ | 29/874 |
| 6,693,003 B2 * | 2/2004 | Okuda | ........................ | 438/239 |
| 6,863,795 B2 * | 3/2005 | Teerlinck et al. | ............. | 205/210 |
| 6,867,136 B2 * | 3/2005 | Basol et al. | .................. | 438/687 |
| 6,943,112 B2 * | 9/2005 | Basol et al. | .................. | 438/687 |
| 7,097,755 B2 * | 8/2006 | Basol et al. | ................... | 205/93 |
| 2001/0013472 A1 * | 8/2001 | Nakamura et al. | ........... | 205/103 |
| 2001/0032787 A1 * | 10/2001 | Uzoh et al. | .................. | 205/118 |
| 2003/0063403 A1 * | 4/2003 | Nishikawa et al. | ............. | 360/17 |
| 2004/0226827 A1 * | 11/2004 | Matsuda et al. | .............. | 205/123 |
| 2005/0092611 A1 * | 5/2005 | Kim et al. | .................... | 205/123 |

* cited by examiner

*Primary Examiner*—Bruce F Bell
(74) *Attorney, Agent, or Firm*—Thomas Swenson

(57) ABSTRACT

To make a metal feature, a non-plateable layer is applied to a workpiece surface and then patterned to form a first plating region and a first non-plating region. Then, metal is deposited on the workpiece to form a raised field region in said first plating region and a recessed region in said first non-plating region. Then, an accelerator film is applied globally on the workpiece. A portion of the accelerator film is selectively removed from the field region, and another portion of the accelerator film remains in the recessed acceleration region. Then, metal is deposited onto the workpiece, and the metal deposits at an accelerated rate in the acceleration region, resulting in a greater thickness of metal in the acceleration region compared to metal in the non-activated field region. Then, metal is completely removed from the field region, thereby forming the metal feature.

32 Claims, 8 Drawing Sheets

SELECTIVELY ACCELERATED PLATING OF METAL FEATURES

RELATED APPLICATIONS

This application is a divisional application under 37 CFR 1.53(b) of co-owned and co-pending U.S. patent application Ser. No. 10/947,085, filed Sep. 21, 2004, by Mayer et al., having the title "Selectively Accelerated Plating of Metal Features", which was a continuation-in-part application under 37 CFR 1.53(b) of U.S. patent application Ser. No. 10/824,069, filed Apr. 13, 2004, by Drewery et al., now U.S. Pat. No. 7,405,163.

FIELD OF THE INVENTION

The invention relates in general to the structure and fabrication of metal features in electronic equipment, and more particularly to forming copper wires in printed wiring boards and semiconductor packaging.

BACKGROUND OF THE INVENTION

Relatively large copper lines in electronic equipment, for example, in a printed wiring board ("PWB"), are typically formed by a process including lamination, photolithography, and wet etching. A wet etch is generally isotropic. Therefore, such processes are usually limited to the formation of relatively wide copper lines so that undercutting of copper is small relative to the amount of metal in the copper line.

Copper lines in printed wiring boards generally have dimensions not less than about 0.5 mm wide and about 20 microns (µm) thick. Typically, more than 30 percent of copper deposited during formation of copper lines in stripped. The resulting copper-contaminated etch solution is a waste product requiring expensive disposal. Significantly larger quantities of copper are consumed in the PWB industry compared to the integrated circuit chip industry. PWB production is acutely price sensitive.

Another method of patterning copper lines, that was also commonly used for making small lines until the invention of the damascene process, is through-resist plating. In this technique, a metal seed layer is first deposited to cover completely a base plane substrate, resist is applied over the seed layer, and areas to be plated-up are optically exposed and developed (wherein the resist is removed to expose copper seed at the base). Then, during electroplating, metal is deposited only in the exposed and developed areas. In such a technique, copper can be plated controllably only to the thickness of the resist. If additional copper is plated, it is no longer confined by the walls of the lines defined by the resist, and will tend to grow conformally and encroach into other lines due to plating both up and sideways. Also, in this technique, the plating solution contacts the resist. As a result of leaching of organic electroactive contamination from the resist, the lifetime of the plating solution is often reduced, adding cost to the overall process. A damascene process is well suited for producing lines of small depth (or height or thickness) in features having high aspect ratio but would be prohibitively expensive for thick copper layers due to the high cost of removing copper from the insulating dielectric surface ("field"). In a damascene process, copper plates onto the field area to a thickness corresponding to the desired height (or thickness) of the wiring line, and all of this excess copper must be removed by chemical mechanical planarization in order to form the copper line.

Thus, none of these techniques is ideally suited to the production of large copper lines, and each incurs considerable costs associated with consumed material and waste disposal. Therefore, it would be desirable to have a technique for plating copper that would create relatively thick wires without the need to remove a large amount of copper, and that would avoid electrolyte contamination associated with through-resist plating, allowing for longer plating bath lifetimes. Preferably, a technique for forming large copper lines would not have to be defined through etching of trenches in a dielectric.

SUMMARY OF THE INVENTION

Embodiments in accordance with the invention provide a method of forming metal wires, particularly copper-containing wires, by an additive process, without using a dielectric etch or chemical mechanical polishing (CMP), and employing minimal isotropic wet etch of the metal. A method in accordance with the invention is useful for replacing through-resist plating, which is presently used for package-level wiring. It is also useful in place of subtractive etch techniques presently used for forming printed wiring boards. In certain embodiments, a thick wire is plated using a thin metal pattern-layer that is substantially a negative of the final desired metal structure. Dry-etch processing is generally not necessary, and consumption of etchants used in conventional subtractive processing and plate-through-resist processing is thereby reduced or eliminated. Preferred embodiments reduce or eliminate exposure of plating bath to resist, thereby extending the useful life of the plating bath. A method in accordance with the invention enables formation of a metal structure on a dielectric layer (or other base layer) of a workpiece, which metal structure is not necessarily embedded in the dielectric layer.

A method in accordance with the invention utilizes a plating accelerator in a novel fashion that was generally disclosed in co-owned and co-pending U.S. patent application Ser. No. 10/739,822 and U.S. Pat. No. 7,405,163, which are incorporated by reference. A generalized method comprises processes of: applying a non-plateable layer to a workpiece; patterning the non-plateable layer and removing a first portion of the non-plateable layer to form a first plating region and a first non-plating region on the workpiece; then using first deposition processes to deposit metal onto the workpiece to form a raised field region in the first plating region and a recessed region in the first non-plating region; then globally applying an accelerator film on the workpiece; then selectively removing a portion of the accelerator film from at least a portion of the raised field region and not removing at least a portion of the accelerator film in the recessed region, thereby forming a non-activated region in the raised field region and an acceleration region in the recessed region; and then using second deposition processes to deposit metal on the workpiece, wherein the accelerator film in the acceleration region increases a rate of metal deposition in the acceleration region relative to a rate of metal deposition in the field region. In some embodiments, a method further comprises processes of removing at least a second portion of the non-plateable layer from the recessed region after the first deposition processes and before applying the accelerator film. In some embodiments, the processes of applying the accelerator film comprise applying a portion of the accelerator film to a metallic surface in the recessed region.

Some embodiments further comprise processes of continuing depositing metal during the second deposition processes until an accelerated thickness of deposited metal in the acceleration region is at least 0.5 µm thicker than a field thickness of metal in the non-activated field region. Generally, a method further comprises processes of removing metal completely from at least a portion of the field region after the second deposition processes of depositing metal. In some embodiments, the processes of removing metal from the field region form a metal structure having a structure width at least two times greater than a structure thickness. In some embodiments, the processes of removing metal from the field region comprise conducting a wet etch.

In preferred embodiments, the processes of applying an accelerator film comprise applying a liquid accelerator solution containing strong chemically or physically adsorbing accelerator species.

In preferred embodiments, the second deposition processes to deposit metal are conducted using a plating solution (electrolytic or electroless), wherein the accelerator solution comprises a greater concentration of the accelerator species than the plating solution. In preferred embodiments, the accelerator solution comprises accelerator molecules selected from a group including 2-mercaptoethane sulfonic acid (MESA), 3-mercapto-1-propane sulfonic acid (MPSA), mercaptopyruvate, 3-mercapto-2-butanol, 1-thioglycerol, dimercaptopropane sulfonic acid (DMPSA), dimercaptoethane sulfonic acid (DMESA), and salts thereof. Some embodiments further comprise processes of removing liquid accelerator solution from the workpiece, after applying the liquid accelerator solution, without substantially removing the accelerator film from the workpiece. In some embodiments, the processes of removing liquid accelerator solution from the workpiece comprise rinsing the workpiece with liquid solvent, the liquid solvent having a lower concentration of accelerator species than a concentration of accelerator species in the liquid accelerator solution. In some embodiments, the processes of removing liquid accelerator solution from the workpiece comprise simultaneous or subsequent drying the workpiece.

Typically, the second deposition processes of depositing metal on the workpiece comprise continuing metal deposition to a desired thickness of metal in the acceleration region, and wherein during continued metal deposition, the accelerator in the acceleration region continues to cause a faster rate of metal deposition in the acceleration region relative to a rate of metal deposition in the non-activated field region. Preferably, the second deposition processes of depositing metal are conducted using a plating technique (electrolytic or electroless).

In some embodiments, the workpiece comprises a metal seed layer, and the processes of applying a non-plateable layer comprise applying the non-plateable layer to the metal seed layer. In some embodiments, the workpiece comprises a base layer, and a method further comprises processes of applying a metal seed layer to the base layer before applying the non-plateable layer to the workpiece.

In some embodiments, the processes of applying a non-plateable layer to the workpiece comprise processes of applying a photoresist layer to the workpiece.

In some embodiments, the first deposition processes comprise depositing copper. In some embodiments, the first deposition processes comprise depositing one or more metals selected from a group including Pt, Rh, Re, Au, Ag, Ir, Ni, W, Mo, Co and alloys thereof. In some embodiments, the second deposition processes comprise depositing copper. In some embodiments, the second deposition processes comprise electroplating or electroless plating of copper.

In preferred embodiments, the first deposition processes form a raised field region in the first plating region having a thickness sufficiently large so that, in the subsequent selective accelerator removal step, the widest recess region does not have accelerator remove therein. In practice, this requires the film to be at least about 25 nm higher than a bottom of the recessed region in the first non-plating region for features up to 100 μm wide.

Some embodiments include depositing an adhesion/barrier layer on the base layer before applying a seed layer or the non-plateable layer.

DETAILED DESCRIPTION OF THE INVENTION

Figure 1:
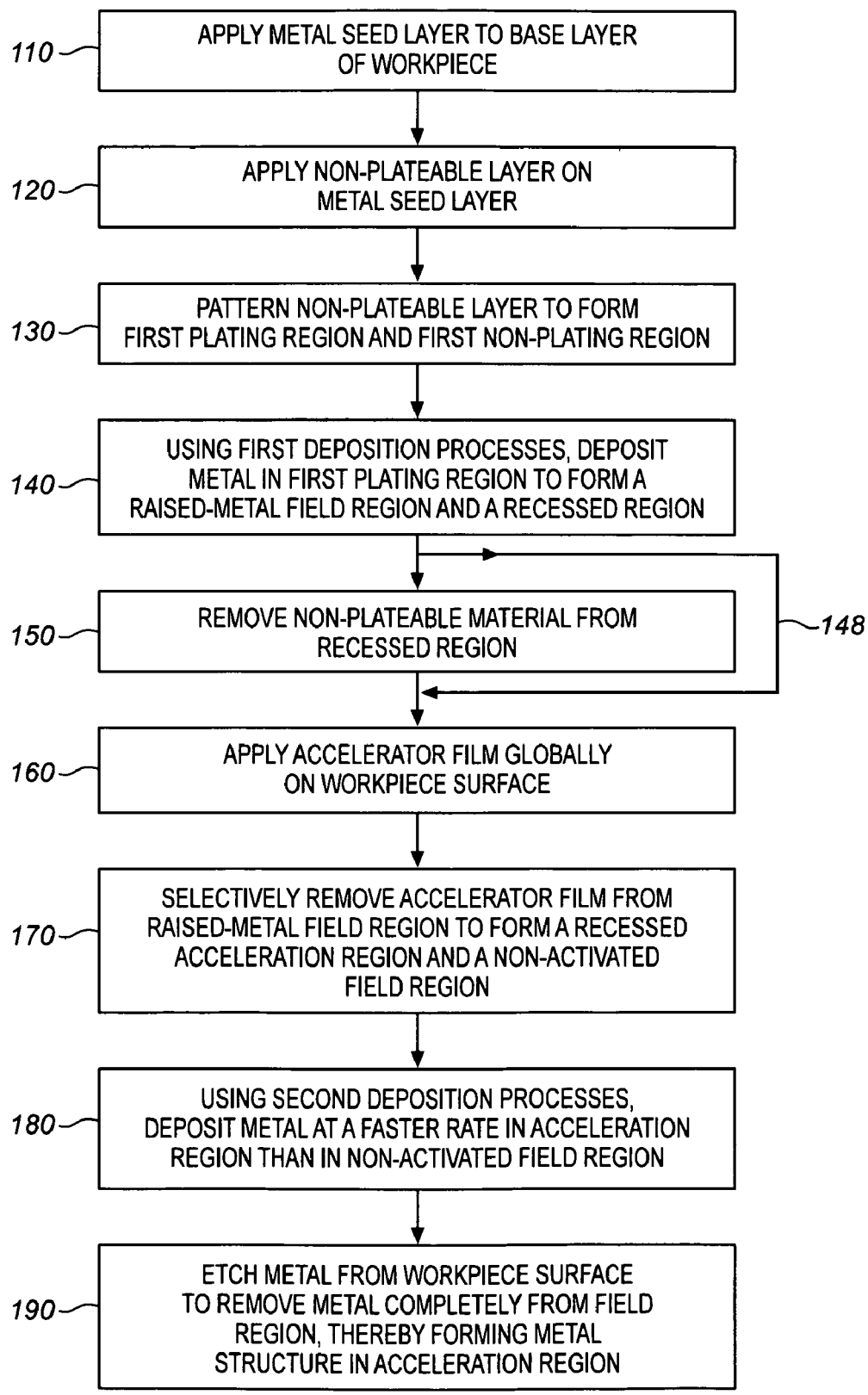
FIG. 1 depicts a process flow diagram of fabrication processes of an exemplary method in accordance with the invention for making a copper wiring line on a printed wiring board ("PWB")

Embodiments in accordance with the invention are described herein with reference to FIGS. 1-19. It should be understood that FIGS. 2-14, 18-19 depicting an electronic device in sequential stages of fabrication in accordance with the invention, are not meant to be actual cross-sectional views of an actual electronic device. In actual devices, the layers will not be as regular and the thicknesses may have different proportions. The various layers in actual devices often are curved and possess overlapping edges. The figures instead show idealized representations which are employed to explain more clearly and fully embodiments of the invention than would otherwise be possible. Also, the figures represent only one of innumerable variations of electronic devices that can be fabricated in accordance with the invention.

In the embodiments described below, a "damascene" technique is used to create a relatively large metal feature, such as a metal wire. The present technique in accordance with the invention is, however, not to be confused with the generally used damascene method for forming copper wires because the present technique does not usually include dry-etching, metal-CMP processes, or forming a metal structure embedded in a dielectric layer.

In certain embodiments in accordance with the invention, an accelerator is applied to the surface of a workpiece and then selectively removed from a portion of the surface. When the resulting surface is plated in a suppressing electrolyte, copper grows as much as 20 times faster in regions still containing accelerator than in regions from which the accelerator was removed. Thus, after selective application of an accelerator to the surface of a workpiece, metal plating generates a thicker metal in the acceleration regions than in non-accelerated (non-activated) regions. Techniques for selective plating of metal onto a surface have been described in co-pending and co-owned U.S. patent application Ser. No. 10/739,822, filed Dec. 17, 2003, by Mayer et al., having the title "Method for Planar Electroplating", and in U.S. Pat. No. 7,405,163, issued Jul. 29, 2008, to Drewery et al., which are incorporated by reference.

The word "substrate" herein can mean an entire workpiece, an underlying insulative material on which wiring is formed, as well as any object on which some material is deposited. In this disclosure, the terms "substrate", "workpiece surface" and related terms generally mean the surface of the workpiece as it exists at a particular phase of fabrication and on which a particular fabrication process is being conducted. The term "base layer" and related terms refer generally to a layer of material that is substantially electrically insulating, such as and interlevel dielectric layer (ILD) or a passivation layer. Typically, a base layer also includes electrically conductive elements, such as a conductive plug or metal wiring, or a circuit device.

The long dimensions of workpiece 202, insulating base layer 204, and metal seed layer 206 in FIGS. 2-14, 18-19 define planes that are considered to be a "horizontal" plane herein, and directions perpendicular to this plane are considered to be "vertical". Terms of orientation herein, such as "above", "top", "upper", "below", "bottom" and "lower", mean relative to base layer 204. That is, if a second element is "above" a first element, it means it is farther from base layer 204; and if it is "below" another element, then it is closer to base layer 204 than the other element. Similarly, dimensional terms, such as "high" and "higher", have very usual meanings with reference to the horizontal plane defined by the long dimensions of workpiece 202, base layer 204, and seed layer 206 in FIGS. 2-14, 18-19. Terms such as "thickness", "depth" and "height" refer to a dimension in a vertical direction, and the terms "wide" and "width" refer to a dimension in the horizontal direction. Terms such as "above" and "below" do not, by themselves, signify direct contact. However, terms such as "on" or "onto" usually signify direct contact of at least a portion of one layer with at least a portion of an underlying or adjacent layer. As depicted in FIGS. 2-14, a single metal wire 280 (FIG. 12) is formed on insulating base layer 204 of workpiece substrate 202. It is understood that embodiments in accordance with the invention are suitable for fabricating a plurality of wires or other relatively coarse metal features in single or multilayer electronic devices.

The term "plating" refers generally to wet methods of depositing metal, including electrochemical and electroless techniques known in the art. Methods in accordance with the invention are also practiced by depositing metal using dry techniques; for example, using PVD techniques known in the art.

The term "non-plateable layer" and related terms are used broadly in the specification to refer generally to material on which either the rate of deposition or the adherence of metal in the first deposition processes is much less than on the workpiece surfaces not covered by "non-plateable" material. For example, in some embodiments in accordance with the invention, the non-plateable material comprises patterned photoresist material located on a metal seed layer, and copper is deposited and adheres well on the metal seed layer during first electroplating deposition processes, but virtually no copper deposits on the photoresist material. The terms "non-plateable layer", "resist layer", "photoresist" and related terms mean a layer that can be formed and patterned on a workpiece during manufacturing processes, and then removed by techniques that do not etch or remove significant amounts of other materials (e.g., copper or other metals) from the workpiece. Because a non-plateable layer used in accordance with the invention typically is completely removed from a workpiece substrate, the degree of electrical conductivity of the non-plateable layer is usually not important; that is, the non-plateable material typically may be conductive, nonconductive or semiconductive. A non-exhaustive list of examples of conductive non-plateable layers includes films of Ta, Ti, W, TaN, TiN. Similarly, a non-exhaustive list of examples of non-plateable non-conductive and semiconductive films include $SiO_2$, SiC, SiN, and certain forms of amorphous carbon films.

The terms "accelerator", "accelerator species" and related terms are used interchangeably in this specification to designate chemical species that activate the surface of a workpiece and enable a greater rate of metal deposition than in areas with less or no accelerator. The terms "accelerator" and "accelerator species" also include a chemical species that transforms during a method in accordance with the invention into another species that activates the surface of a workpiece. The term "species" is used broadly to include an atom, a molecule, a molecular fragment or group, and their combinations and complexes. The terms "accelerator", "accelerator film" and related terms are also used broadly to designate both accelerator species and also a formulation that includes accelerator species, but which can also include other materials, such as liquid or dried solvent, precursor compounds of accelerator species, and formulation materials. While the term "accelerator solution" is used broadly here to mean any liquid suitable for use as an accelerator, an accelerator solution in accordance with the invention typically comprises a known amount of accelerator molecules dissolved in a liquid solvent. It is understood that, alternatively, the accelerator could be attached to the workpiece via a vapor phase interaction, negating the need for forming an acceleration solution. In such a case, the accelerator is applied to the surface from an accelerator gas or gas mixture. The meaning of the various terms as used is clear from their context. While not being bound to a particular theory or mechanism, it is believed that accelerator molecules referred to in the specification provide accelerator species that are adsorbed on a workpiece surface, which accelerator species activate the surface. Exemplary accelerators in accordance with the invention are described in co-owned and co-pending U.S. patent application Ser. No. 10/739,822 and U.S. Pat. No. 7,405,163, which are incorporated by reference.

The accelerating effect of certain accelerator species in accordance with the invention is also long lived. The accelerating effect persists even when surfaces on which the accelerator was initially deposited have been embedded deep inside a growing plated film. The accelerator appears to "float" on the metal surface and not be substantially incorporated into the film while the film is growing (at least not to an extent of significantly diminishing the acceleration effect). Without being bound to a particular theory, it is assumed for purposes of explanation that the accelerator remains on the surface throughout the deposition process unless removed (e.g., removed by a rubbing process).

The terms "acceleration region", "activated surface" and related terms and, on the other hand, the terms "non-activated region", "suppressed region" and similar terms are relative terms. The terms acceleration region and related terms refer to a region or area comprising a higher concentration of attached accelerator species relative to a non-accelerated (or suppressed region), and the higher concentration of accelerator species in an acceleration region is able to cause a faster rate of metal deposition than in a non-accelerated (non-activated) region.

The term "metal line", "wiring line" and related terms are used generally interchangeably in this specification, including the claims, to refer to relatively coarse wiring or other relatively coarse metal structure or feature (e.g., a contact pad) in an electronic device. Relatively coarse wiring is used, for example, in printed wiring boards and for package-level wiring in various electronic devices. A course wiring line or other relatively large metal feature described in this specification typically has a thickness in a range of about from 1 μm to 100 μm. Nevertheless, methods in accordance with the invention are also suitable for making metal features having relatively small or large dimensions; for example, wiring lines or metal contacts having a width of about 20 nm or larger and a proportional thickness.

The terms "region" and "area" as used herein generally have their usual meaning; that is, "area" generally designates a two-dimensional surface, whereas a "region" is generally three-dimensional. For example, the term "recessed region" refers to a region surrounded by a raised region, while the term "field region" generally refers to an initially raised or exposed feature of the workpiece. It is clear that the relative heights of a recessed region and a field region change during formation of a metal structure in accordance with the invention. Thus, terms referring to a region are also sometimes used in the specification and claims to designate a particular location on the workpiece and to differentiate the location from another workpiece location. Thus, terms such as "recessed region", "acceleration region", and "field region" are also used to designate particular footprint areas of a workpiece surface.

The terms "then", "after", "thereafter" and similar terms are used interchangeably in specification to indicate that a particular process or set of processes is conducted sometime after a previous process. These terms do not necessarily signify immediately thereafter.

"Global" and related terms mean that a process is performed on a substantial portion of a workpiece surface, typically the entire surface; for example, including both field (exposed) and recessed regions of a surface.

The diagram of FIG. 1 is a process flow diagram of fabrication processes of a method 100 in accordance with the invention for making a copper wiring line on a printed wiring board ("PWB") in accordance with the invention. Although method 100 of FIG. 1 is discussed herein with reference to FIGS. 2-14, 18-19 representing a PWB workpiece, it is clear that a generalized method of FIG. 1 and numerous embodiments of methods in accordance with the invention are useful generally for fabricating a metal line or other metal structure (e.g., a metal contact pad) that comprises one or more metals in addition to or instead of copper and that has a relatively small aspect ratio (e.g., depth/width≦0.2).

Figure 2:
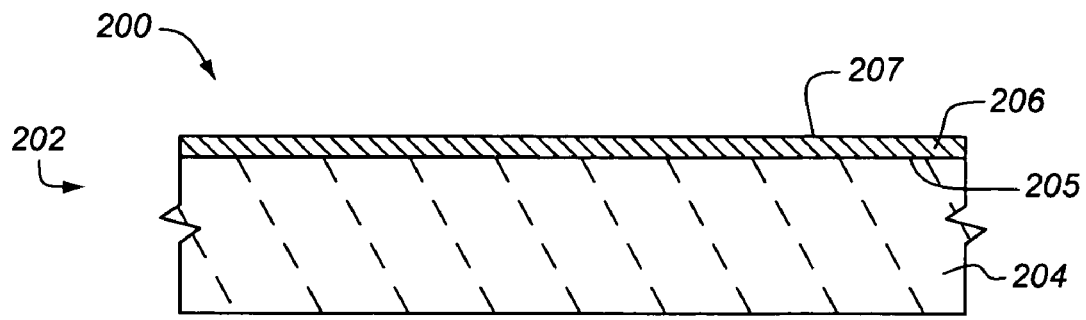
FIG. 2 depicts schematically a workpiece having an insulating dielectric base layer covered by a metal seed layer.

FIG. 2 depicts schematically a section 200 of workpiece 202 having an insulating dielectric base layer 204 with an upper surface 205. Base layer 204 typically comprises silicon oxide or other dielectric material (including low-K dielectrics such as CORAL™ of Novellus Systems Inc.). Layer 204 may also comprise, for example, a glass-reinforced epoxy laminate. Processes 110 of method 100 include applying a metal seed layer 206, having an upper surface 207, using techniques known in the art. Metal seed layer 206 typically has a thickness in a range of about from 5 nm to 50 nm. Metal seed layer 206 generally is applied by plasma vapor deposition ("PVD") or by electroless plating. A PVD seed layer may be deposited in any of a number of commercially available systems. For semiconductor wafers and similar substrates, the Novellus model "INOVA™" tool is suitable. Atomic layer deposition techniques (ALD) are also potentially useful. Electroless copper or other metal seeds may be deposited using any of a variety of solutions that are well-known in the art, usually after activation of the workpiece surface by a catalyst, such as metallic palladium. Suitable materials for depositing on the workpiece to form metal seed layer 206 include Cu, Ru, Ni, Co, Fe, Pd, among others. In other embodiments of methods in accordance with the invention, a metal seed layer is not deposited on workpiece 202.

Processes 110 often also include depositing on the workpiece a metal-containing adhesion layer or barrier layer (not shown), e.g., a layer of Ta, Ti, TiW, or TiN having a thickness in a range of about 5 nm to 50 nm, before depositing seed layer 206. As a result, a metal-containing adhesion/barrier layer material is formed on surface 205 of base layer 204 before formation of seed layer 206. Techniques for depositing a metal-containing adhesion/barrier layer are well known in the art.

Figure 3:
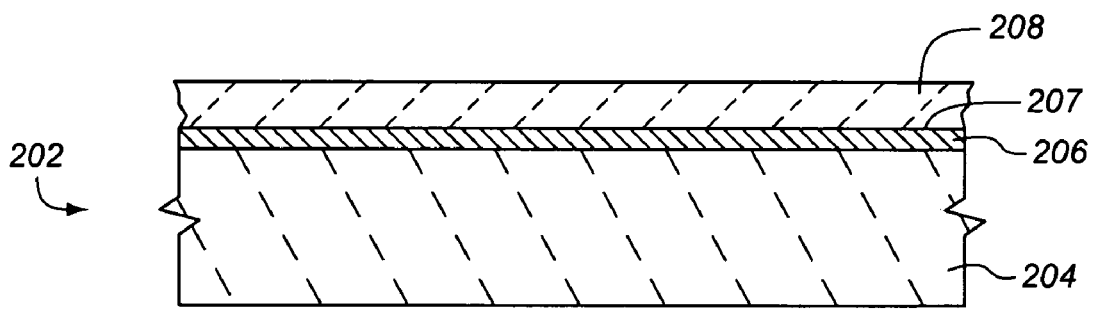
FIG. 3 depicts schematically the workpiece of FIG. 2 after a non-plateable photoresist layer in accordance with the invention has been deposited on the workpiece surface.

Processes 120 include depositing a non-plateable layer 208 on upper surface 207 of metal seed layer 206, which is the surface of workpiece 202 as depicted in FIG. 3. In method 100, non-plateable layer 208 is formed by applying a non-plateable photoresist layer 208 using conventional techniques to metal seed layer 206. The thickness of non-plateable photoresist layer 208 is not critical; typically the thickness of photoresist layer 208 is in a range of about from 0.2 µm to 1 µm.

Figure 4:
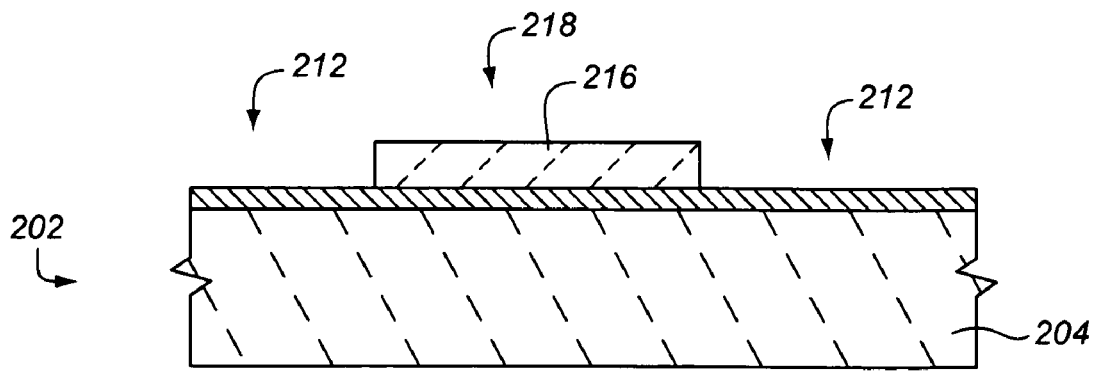
FIG. 4 depicts schematically the workpiece of FIG. 3 after the non-plateable layer has been patterned and developed to form a plating region and a non-plating region in accordance with the invention.

In processes 130, as depicted in FIG. 4, non-plateable photoresist layer 208 is patterned and developed using conventional photolithographic techniques to remove a portion of non-plateable layer 208 corresponding to first plating region 212, leaving a portion 216 of non-plateable layer 208 corresponding to first non-plating region 218. First non-plating region 218 typically has a width in a range of about from 2 µm to 5 mm. It is understood that other techniques and processes instead of processes 120 and 130 are useful for making first plating region 212 and first non-plating region 218.

Figure 5:
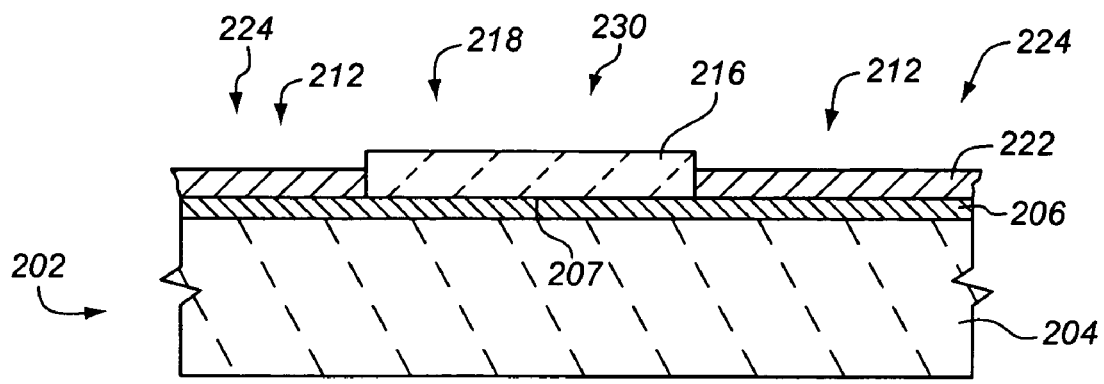
FIG. 5 depicts schematically the workpiece of FIG. 4 after a metal pattern-layer has been deposited in accordance with the invention in the plating region, thereby forming a recessed region in the non-plating region.

In first deposition processes 140, as depicted in FIG. 5, metal pattern-layer 222 is deposited using conventional metal-deposition techniques in first plating region 212. As depicted in FIG. 5, there is no significant deposition of metal in processes 140 in first non-plating region 218 because the composition of portion 216 of non-plateable layer 208 substantially inhibits the deposition or adhesion of metal onto portion 216. The composition of non-plateable photoresist layer 208 depends on the type of deposition techniques used in first deposition processes 140 and on the type of metal deposited in first deposition processes 140. For example, when processes 140 include electroplating copper onto the surface of workpiece 202, useful non-plateable materials include conductive non-plateable materials, such as Ta, Ti, W, TaN, and TiN. Similarly, a non-exhaustive list of examples of non-plateable non-coductivie and semiconductive films include $SiO_2$, SiC, SiN, and certain forms of amorphous carbon films, among others. For practical reasons arising from current technology, as explained below, the thickness of metal pattern-layer 222 preferably is not less than about 25 nm. In first deposition processes 140, metal pattern-layer 222 forms a raised-metal field region 224 that is raised with respect to upper surface 207 of metal seed layer 206. Because deposition of metal is substantially inhibited or prevented by non-plateable material 216 in first non-plating region 218 during first deposition processes 140, raised metal pattern-layer 222 defines a recessed space 230 corresponding to first non-plating region 218. Accordingly, recessed region 230 typically has a width in a range of about from 2 µm to 5 mm corresponding approximately to the width of first non-plating region 218. In FIG. 5, non-plateable portion 216 is depicted having a greater height than pattern-layer 222. It is understood, however, that the relative heights of non-plateable portion 216 and metal pattern-layer 222 are not critical in practicing the invention. The terms "plating region" and "non-plating region" are used broadly herein to refer generally to regions in which deposition of metal in first deposition processes 140 occurs selectively by whatever deposition techniques are used in processes 140. In other words, in some embodiments in accordance with the invention, first deposition processes 140 do not comprise metal plating techniques, but instead comprise other metal deposition techniques. In some embodiments, the first deposition processes comprise depositing one or more metals selected from a group including Pt, Rh, Re, Au, Ag, Ir, Ni, W, Mo, Co and alloys thereof.

Figure 6:
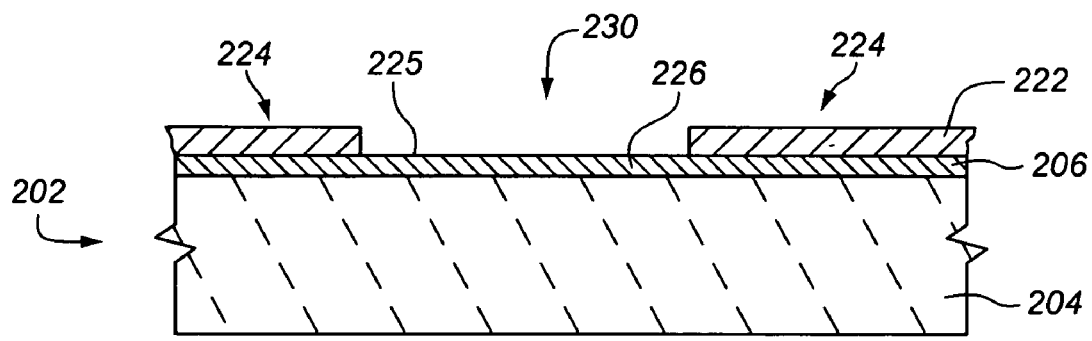
FIG. 6 depicts schematically the workpiece of FIG. 5 after non-plateable material has been removed from the recessed region.

In processes 150, as depicted in FIG. 6, non-plateable portion 216 is removed from recessed region 230. For example, photoresist material, such as one of the PMGI series resists available from Microchem Inc. of Newton, Mass., or Shipley Megaposit SPR220-7 from Rohm and Haas Electronic Materials, Inc., is removed using conventional stripping techniques such as a treatment with a proprietary liquid stripping composition or by dry ashing. In method 100, non-plateable portion 216 is removed down to upper surface 225 of seed layer portion 226 of metal seed layer 206 corresponding to recessed region 230.

In methods in accordance with the invention, plating accelerator is caused to become attached to workpiece 202 selectively in recessed region 230, particularly on seed layer portion 226, with relatively little or no accelerator ultimately attached to metal pattern-layer 222 in field region 224. Generally, accelerator molecules are applied globally on the workpiece substrate, in particular, on metal seed layer portion 226, and then the accelerator is selectively removed from metal pattern-layer 222, resulting in a higher concentration of accelerator in recessed region 230.

Figure 7:
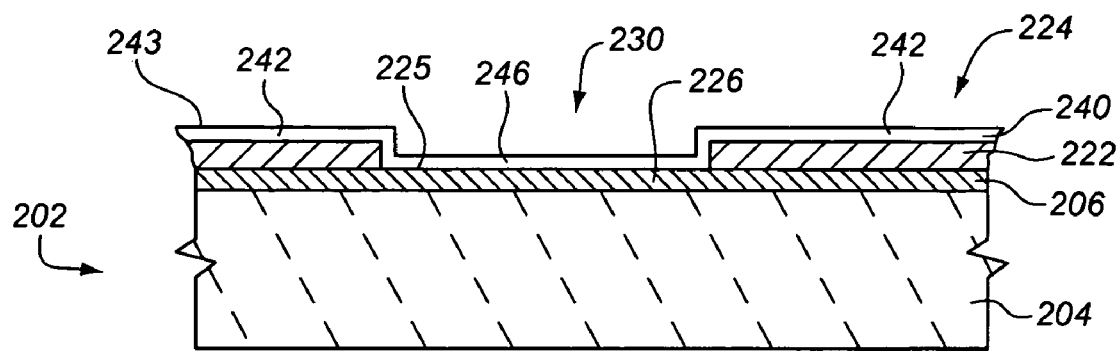
FIG. 7 depicts schematically the workpiece of FIG. 6 after a liquid accelerator solution is applied globally to the workpiece surface to form an accelerator film.

Accordingly, in processes 160, as depicted in FIG. 7, a liquid accelerator solution is applied globally to the surface of workpiece 202 to form an accelerator film 240. Although accelerator film 240 is depicted for clarity in FIG. 7 as an extended layer, it is believed that the adsorption of only a monolayer (or even a fraction of a monolayer) of accelerator molecules is actually adsorbed to the workpiece surface in many cases (i.e., to surface 225 of seed layer portion 226 and to the surfaces of metal pattern-layer 222). In FIG. 7, accelerator film 240 comprises an accelerator film portion 242 having upper surface 243 on metal pattern-layer 222 in field region 224 and an accelerator film portion 246 in recessed region 230.

Figure 18:
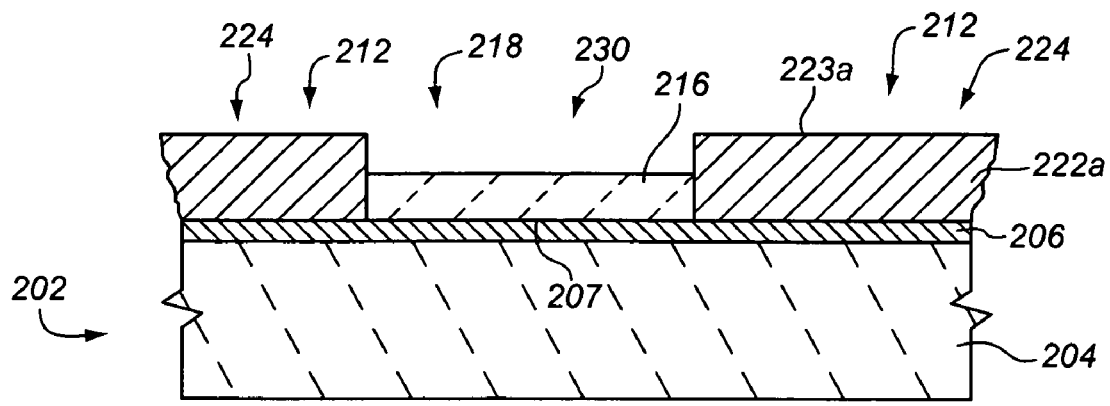
FIG. 18 depicts schematically the workpiece of FIG. 4 after a metal pattern-layer has been deposited in accordance with the invention in the plating region, thereby forming a recessed region in the non-plating region.
Figure 19:
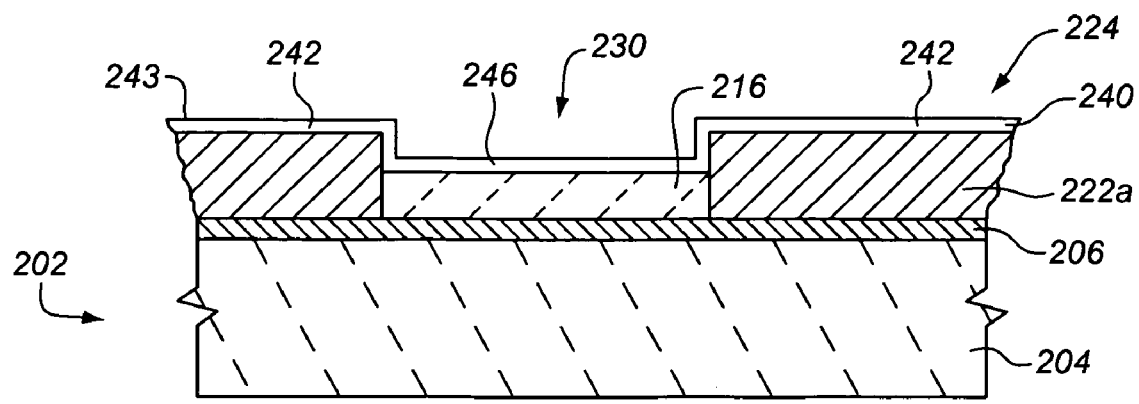
FIG. 19 depicts schematically the workpiece of FIG. 18 after a liquid accelerator solution is applied globally to the workpiece surface to form an accelerator film.

Some embodiments of methods in accordance with the invention do not include removal of non-plateable portion 216 in processes 150. For example, as depicted in FIG. 18, in some embodiments, first deposition processes 140 include depositing metal pattern-layer 222a to a height 223a that is higher than non-plateable portion 216, resulting in raised field region 224 and recessed region 230. In such embodiments, processes 150 to remove non-plateable portion 216 are optional, as indicated by process path 148 in FIG. 1. In embodiments that do not include removing non-plateable portion 216 in processes 150, accelerator film 240 is deposited on workpiece 202 in processes 160 so that accelerator film portion 246 in recessed region 230 is formed over non-plateable portion 216, as depicted in FIG. 19.

Figure 8:
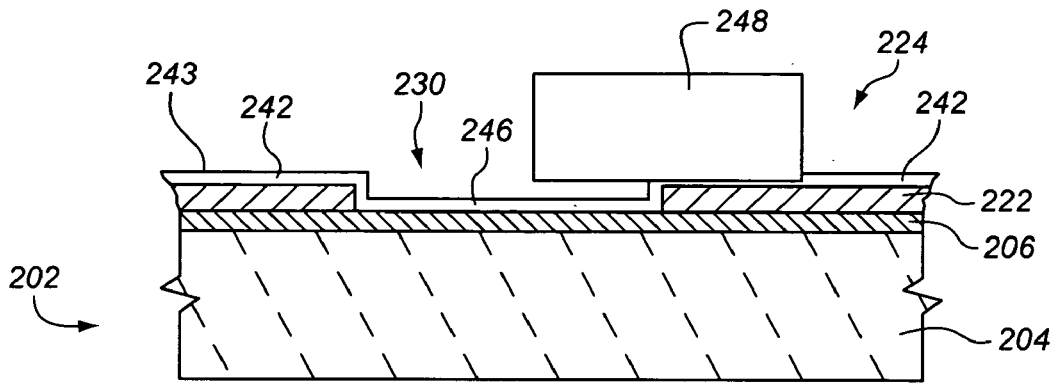
FIG. 8 depicts schematically the workpiece of FIG. 7 as a portion of the accelerator film is selectively removed from a field region of the metal pattern-layer adjacent to the recessed region.

After processes 160 (FIG. 7 or FIG. 19), processes 170 are performed to remove selectively portions of accelerator film from raised field region 224, as depicted in FIG. 8. In processes 170, accelerator film 240 is selectively removed from metal pattern-layer 222, 222a of field region 224; that is, accelerator film portion 242 is substantially removed, while accelerator film portion 246 in recessed region 230 is not substantially removed, as depicted in FIG. 8. Typically, accelerator portion 222 is selectively removed from the workpiece surface, that is, from metal pattern-layer 242, using a suitable device such as a pad 248, as depicted in FIG. 8. Pad 248 should have mechanical properties that allow it to conform to slight large-scale bowing of the substrate (length scale>1 cm) while, on the scale of the metal features to be deposited (generally <0.05 cm), rubbing only raised metal pattern-layer 242 and not rubbing accelerator film portion 246 in recessed region 230. For this reason, using current rubbing technology, recessed region 230 formed in processes 130, 140, and 150, preferably has a depth of about 25 nm or greater measured from the bottom 225 of recessed region 230 to the upper surface 243 of adjacent metal pattern-layer 242. Many CMP pads have been developed for similar purposes. A conventional tool is adaptable for particular applications of the invention; for example, when a PWB is being fabricated, a roller coated with pad material is passed over the wiring board.

Figure 9:
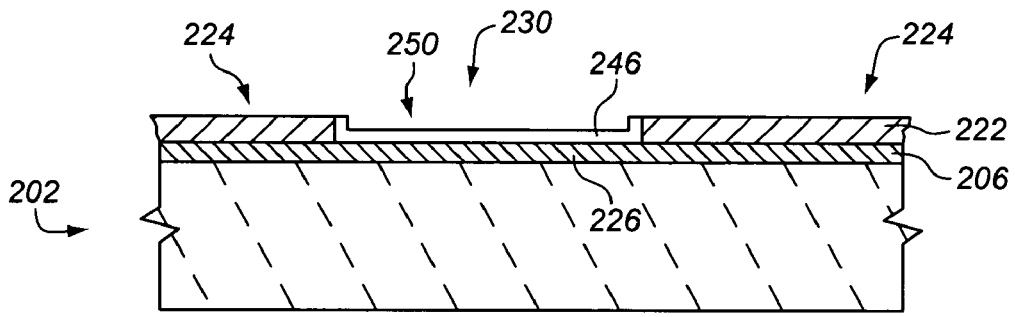
FIG. 9 depicts schematically the workpiece of FIG. 8 after a portion of the accelerator film is selectively removed from the field region, thereby forming an acceleration region in the recessed region.

After processes 170, the resulting selectively high concentration of accelerator film portion 246 in recessed region 230 forms an acceleration region 250, as depicted in FIG. 9.

Figure 10:
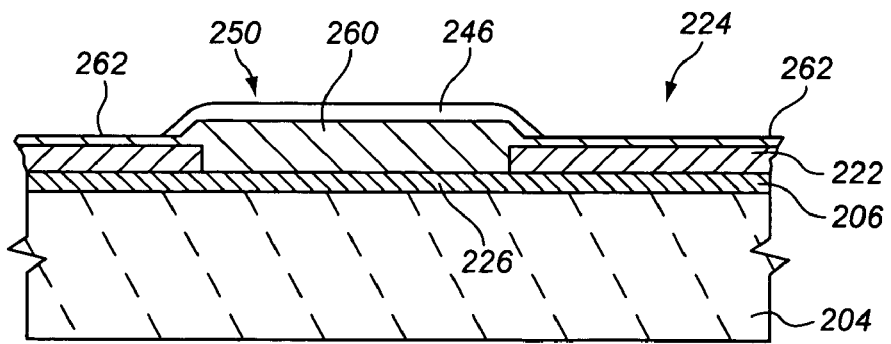
FIG. 10 depicts schematically the enhanced plating of copper in the acceleration region during an intermediate phase of plating, in which copper in the acceleration region is shown to be thicker than the surrounding copper plated in the field region.
Figure 11:
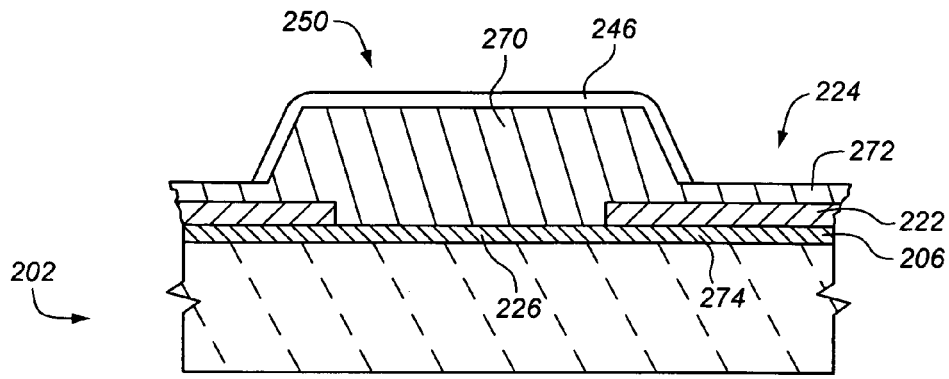
FIG. 11 depicts schematically the workpiece of FIG. 10 after continued electroplating processes in which the copper plated into the acceleration region continues to grow vertically with slight sideways spreading because accelerator enhances electroplating relative to plating in the field region.

Second deposition processes 180 comprise electroplating of copper onto the workpiece, particularly onto metal seed layer portion 226 covered by accelerator film portion 246 in recessed region 230 (i.e., in acceleration region 250). Typically, copper does not plate (or plates at a substantially slower rate) onto non-activated metal pattern-layer portion 222 in field region 224, which contains little or no accelerator because accelerator film portion 242 was removed in processes 170. In accordance with the invention, copper plates at an increased, or accelerated, rate in acceleration region 250 compared to plating in field region 224. The enhanced plating of copper in acceleration region 250 is depicted in FIG. 10, in which copper 260 plated in acceleration region 250 during an intermediate phase of plating is shown to be thicker than the surrounding copper 262 plated on metal pattern-layer 242 in non-activated field region 224. In FIG. 10, accelerator film portion 246 is depicted as having "floated" on the surface of the plated copper 260 as it grows. A typical electroplating solution includes copper sulfate at a concentration of about 20 grams/liter, 2 molar sulfuric acid, and about 0.6 volume percent of a high molecular weight (>500 g/mole) polyethylene glycol suppressor. Specific examples of suppressors include: S2001 from Shipley Company, block copolymer L92 from Pluronics, Inc., or one of a large number of long chain polymers of polyethylene oxide, polypropylene oxide or block or random copolymers of the related monomers. A low concentration (10 ppm to 100 ppm) of chloride ion is often included in the plating solution, which aids in the suppressor's functionality. Copper and other metals can also be plated using electroless techniques known in the art. It is understood that a method in accordance with the invention is suitable for making wiring lines comprising one or more metals in addition to or instead of copper metal, and the deposition can be performed using electroless plating (using a reducing agent) rather than electroplating (using a power supply) to reduce the metal and cause metal to deposit. As depicted in FIG. 11, as electroplating processes 180 continue, the copper 270 plated into acceleration region 250 continues to grow vertically with little sideways spreading because accelerator 246 enhances electroplating relative to copper plating 272 in field region 224. As a result, accelerated copper portion 270 located at acceleration region 250 is significantly thicker than field copper portion 272 in field region 224. Plating of copper is continued until a desired difference in thickness is achieved between copper 270 in acceleration region 250 and copper 272 in field region 224. Plating need not be continuous or uninterrupted; that is, plating may be interrupted or varied one or several times before a desired difference in thickness is achieved between copper in acceleration region 250 and copper in non-activated field region 224. For example, it may be desirable under certain circumstances to remove accelerator between plating procedures, add more accelerator, repeat the removal rubbing steps, or to vary plating solutions. In some embodiments, second deposition processes 180 comprise depositing metal in acceleration region 250 to a thickness in a range of about from 1 μm to 100 μm.

Processes 190 include wet etching of copper portion 272, metal pattern-layer 222 and metal seed layer portion 274 from field region 224 as depicted in FIG. 11. Wet etching is typically conducted using a ferric chloride solution well-known in the PWB industry and reported extensively in the literature. Another useful etching solution contains 0.5 to 10 g/L glycine and 3 to 40% hydrogen peroxide. This type of solution is particularly advantageous because its reaction is surface-controlled (thus avoiding an undesirable line-etch-rate acceleration once the field has cleared) as well as having a non-grain specific etching character. Other oxidizers (e.g., persulfates, permanganate) may also be used. Other techniques of selectively removing copper (or other metal, if present) can also be used. Processes 190 are conducted to remove completely all metal and any other conductive materials from field region 224 adjacent to acceleration region 250. Wet etching is typically conformal. Therefore, during processes 190, metal is etched from exposed surfaces of copper 270 at approximately the same rate as metal etched from field region 224, resulting in etching of metal from the top and sides of copper 270 approximating the combined thickness of copper portion 272, metal pattern-layer 222 and metal seed layer portion 274 present in field region 224.

Figure 12:
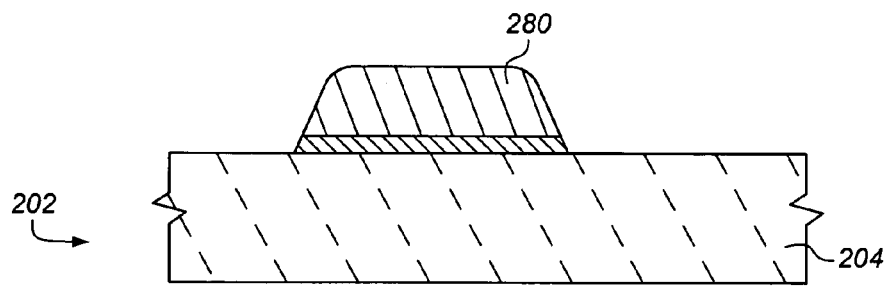
FIG. 12 depicts schematically the workpiece of FIG. 11 after wet etching to remove metal completely from the field region, thereby forming a wiring line.

The result of processes 110-190 of method 100 is formation of copper metal wiring line 280 located on insulating base layer 204 of workpiece 202, as depicted in FIG. 12. A method in accordance with the invention enables formation of a metal structure on a dielectric layer (or other base layer) of a workpiece, which metal structure is not necessarily embedded in the dielectric layer. A potential benefit of a metal structure being not embedded in a dielectric material is improved line speed associated with the lower k value of its environment (air vs. typically $SiO_2$ dielectric In preferred embodiments, copper is removed from field region 224 in processes 190 using an isotropic wet etching technique without first depositing a mask covering the metal in acceleration region 250. Therefore, the thickness of copper removed by etching from copper portion 270 in acceleration region 250 during processes 190 generally is roughly equivalent to the maximum thickness of copper (or other metal) that needs to be removed from field region 224. For this reason, plating of copper is continued in second deposition processes 180 generally until the difference in thickness and width between thicker copper 270 in acceleration region 250 and less-thick copper in field region 224 approximates the desired final thickness and width of wiring line 280. These considerations are factors, therefore, in designing the width of first non-plating region formed in processes 140 and the amount of etching conducted in processes 190.

Figure 13:
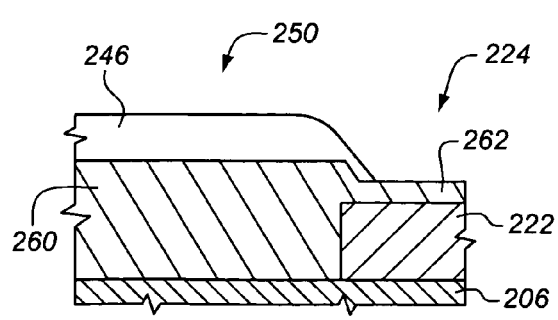
FIG. 13 depicts schematically an intermediate phase of plating processes in which the profile of copper in the acceleration region has just started to protrude above copper in the field region, and also depicts schematically the relative distribution of accelerator on the plated metal surface.
Figure 14:
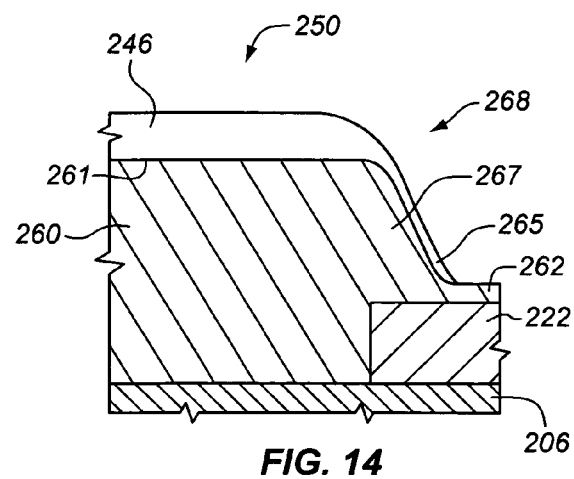
FIG. 14 depicts the workpiece of FIG. 13 in a later phase of plating processes in which the copper portion in the acceleration region has grown vertically at a much faster rate than copper in the field region because of the presence of accelerator on the top surface of copper in the acceleration region.

A feature of a method in accordance with the invention is that it forms a metal wire or other metal feature that does not encroach sideways, as would be the case with a through-resist plating technique. Experience has shown that the lateral mobility of accelerator in accordance with the invention is limited. FIG. 13 depicts an intermediate phase of second deposition processes 180 in which the profile of copper 260 at acceleration region 250 has just started to protrude above metal 222 and copper 262 in field region 224. The relative distribution of accelerator 246 on the metal surface is also depicted. FIG. 14 depicts a later phase of second deposition processes 180 in which accelerated copper portion 260 has grown vertically at a much faster rate than the field copper 262 because of the presence of accelerator 246 on the top surface 261 of copper portion 260 in acceleration region 250. Comparison of FIG. 14 with FIG. 13 shows that the relative amount of sidewall accelerator 265 on sidewall 267 of copper portion 260 decreases in the upward vertical direction as sidewall 267 grows vertically. It is believed that because the amount of acceleration is dependent on the surface concentration of accelerator, the degree of accelerated growth in the horizontal sidewards direction due to the presence of sidewall accelerator 265 decreases with the height of copper portion 260. Accelerated growth continues, however, at the top surface 261 of copper portion 260, especially in central areas away from edges 268. Because of loss of accelerator to the sidewalls, the enhancement of growth at edges 268 gradually decreases, and growth of copper portion 260 tends to taper inwards, instead of continuing to encroach sideways as in conventional conformal deposition. This geometric deceleration is inverse to the geometric acceleration that occurs in bottom-up fill processes in small, high-aspect-ratio features.

Typically, methods in accordance with the invention comprise global activation of the workpiece surface with an accelerator by one or more of a variety of means including, but not limited to: dipping the surface in a solution containing accelerator molecules; spraying the surface with an solution containing dissolved accelerator molecules; drying a surface of a liquid containing dissolved accelerator molecules or precursors of accelerator molecules; depositing a film from a vapor containing the accelerator molecules; electrochemically transforming precursors of accelerating molecules to form a chemically active accelerator, and electrolessly forming an accelerator. "Global activation" means that a substantial portion of the surface, typically the entire surface, including both field (exposed) and recessed regions of the surface, are activated by the accelerator.

Examples of suitable accelerator molecules include mercapto-group-containing molecules, such as 2-mercaptoethane sulfonic acid (MESA), 3-mercapto-1-propane sulfonic acid (MPSA), mercaptopyruvate, 3-mercapto-2-butanol, and 1-thioglycerol. These are typically used in aqueous solutions having a concentration in a range of about 1 ppm to 1000 ppm, generally at a pH-value less than about 5. These and similar accelerators have been found to adsorb strongly to a workpiece surface (e.g., copper metal seed layer) upon simple contact by spraying or immersion, but not to interfere substantially with the kinetics of an overall electrochemical charge transfer process, particularly in baths containing halides. It is likely that a large number of other accelerator molecules, undisclosed here or yet undiscovered, exist. Preferred accelerators in accordance with this invention can be adsorbed (or otherwise attached) onto a workpiece surface or region; are able to be removed selectively from exposed regions (e.g., using a technique such as buffing with a pad); are able to increase substantially the metal deposition rate over a rate observed without the accelerator; and are not significantly incorporated into the deposited metal during the deposition process (i.e., remain substantially accelerating throughout the process).

EXAMPLE 1

Figure 15:
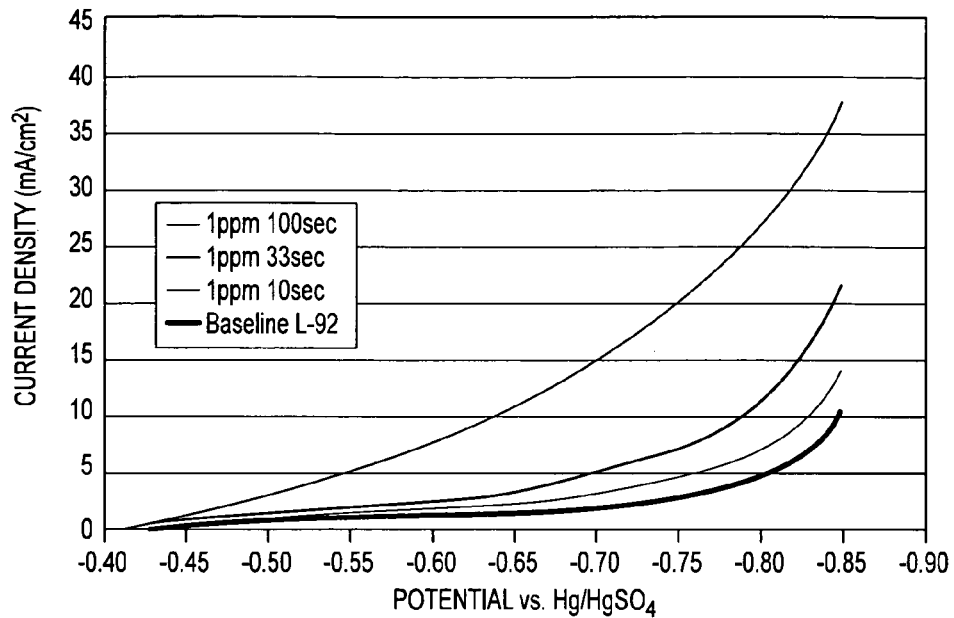
FIG. 15 depicts a voltammetric graph for substrates in an electrolyte whose surfaces were previously exposed to different dosage times in a 1 ppm solution of the accelerator MPSA.

It has been found that simply exposing the surface of a workpiece to certain accelerators like 2-mercaptoethane sulfonic acid (MESA) or 3-mercapto-1-propane sulfonic acid (MPSA) activates the surface. FIG. 15 shows a voltammetric plot (current density versus potential for the treated electrode) for substrates exposed to the accelerator MPSA for different exposure times. A copper rod rotating at 800 rpm was dipped in a solution containing the accelerator MPSA in deionized (DI) water for various exposure times and concentrations, then triple rinsed with DI water and plated in a solution of copper sulfate (40 g/L $Cu^{+2}$), sulfuric acid (30 g/L), chloride ion (50 ppm) and the suppressor Pluronic L-92 (a copolymer of polypropylene oxide and polyethylene oxide, 0.1 g/L)). Between each voltage scan, the surface was electropolished in phosphoric acid and rinsed in water to achieve a reproducible, highly microscopically smooth surface and remove any previously adsorbed accelerator. A clean surface with no prior exposure to the accelerator exhibited very little current over a very wide range of potentials (Baseline L-92 in FIG. 15). With increasing "dosage" of accelerator, (i.e., product of the time of exposure and concentration of the activating solution), the surface became increasingly "depolarized" and exhibited larger "active" currents at any given potential, as shown by the data curves plotted in FIG. 15. It is believed that the fractional surface coverage of the accelerator is increasing with dosage, and hence the accelerating magnitude. At sufficiently high doses, no further increase in plating rate was observed, believed to be associated with a saturation of the absorbed accelerator. In the accelerator-treated examples, the surface was not significantly polarized, showing that the accelerator was absorbed (or possibly adsorbed) without the application of a current. Accordingly, MPSA accelerator can be applied by a simple spray or immersion process, activating the surface everywhere. The accelerator 2-mercaptoethyane sulfonic acid (MESA) and others have been shown to absorb in the same way without the need to apply a current. Because the activating accelerators strongly adhere to the surface, a plating bath need not contain accelerator in certain embodiments of this invention. As known in the art, while many of the accelerator compounds are referred to in the acidic form, it is understood the various salts of the acidic compounds also work well.

An accelerator solution is typically an aqueous solution and may contain small amounts of acids (0.2 to 2 weight %), found to stabilize the chemical in water. Alternatively, an accelerator solution comprises a non-aqueous solvent (e.g., alcohols or ketones) that dissolves the accelerator molecules at the desired concentration. Factors such as material and waste handling costs, activity of the accelerator in the solvent for adsorption to the substrate, and ease of drying influence the selection of the particular solvent. Other components of an accelerator solution may include dissolved copper ions, suppressing plating additives, levelers, or other formulation materials that do not significantly interfere with the accelerator adsorption process but may improve wetting or other subsequent processing. In preferred embodiments, an accelerator solution contains a concentration of accelerator molecules that leads to the saturation of the surface with adsorbed accelerator molecules. At such high concentrations, the amount of adsorbed additive does not depend on the exact solution concentration or the surface exposure time to the solution. Under these conditions, the accelerator solution can be reused several times, treating many substrates, without concern for careful concentration control and process times.

Suitable accelerators do not substantially suppress or retard the metal deposition charge transfer process in an electroplating process, and are effective in inhibiting access of a suppressor compound to the accelerator-containing surface (thereby allowing significantly higher contrasting plating compared to the non-accelerated surface condition in the presence of the suppressor).

It has also been found that in baths containing dimercaptopropane sulfonic acid (DMPSA) or dimercaptoethane sulfonic acid (DMESA), for example, surface depolarization ("activation") of the accelerator can occur only after a high current density and/or potential is applied to the workpiece surface. A sufficiently high current/potential applied for a sufficient time substantially reduces polarization. This effect remains even after returning to lower current/potentials. While not being bound by any particular theory, this threshold current/potential appears to result in one or more reactions that build up a strongly adsorbed activating product. More specifically, it appears that DMPSA is electrochemically reduced to MPSA (and DMESA to MESA), which is the effective accelerating molecule.

Treating the workpiece to provide the plating accelerator typically involves contacting the workpiece with a solution containing the accelerating molecules or their precursors. Contact can be by immersion, spraying, spin coating, vapor deposition, in situ synthesis on the surface, etc. The plating accelerator may attach to the surface by various mechanisms, including chemical adsorption, physical adhesion, and the like. Therefore, the terms "accelerator" and "accelerator film" used in this specification and in the claims below are used broadly to include accelerator molecules or accelerator species contained in or attached to a workpiece surface. After application of the accelerator to the workpiece surface, the workpiece surface may be rinsed to remove entrained accelerator solution (e.g., to avoid transfer of the accelerator additive to subsequent processing modules and their solutions, thereby avoiding contaminating the overall process). Depending on the type of accelerator used and the operational sequence used following its application, the workpiece may be dried prior to selective removal of the accelerator from field regions, or kept wet. Because of the relative chemical stability and the strong adhesion to workpiece surfaces of accelerators in accordance with the invention, it is generally unnecessary to process (e.g., electroplate) the workpiece right after activation with accelerator or after selective removal of accelerator. The work-piece may be stored until it is convenient to perform further processing.

Figure 16:
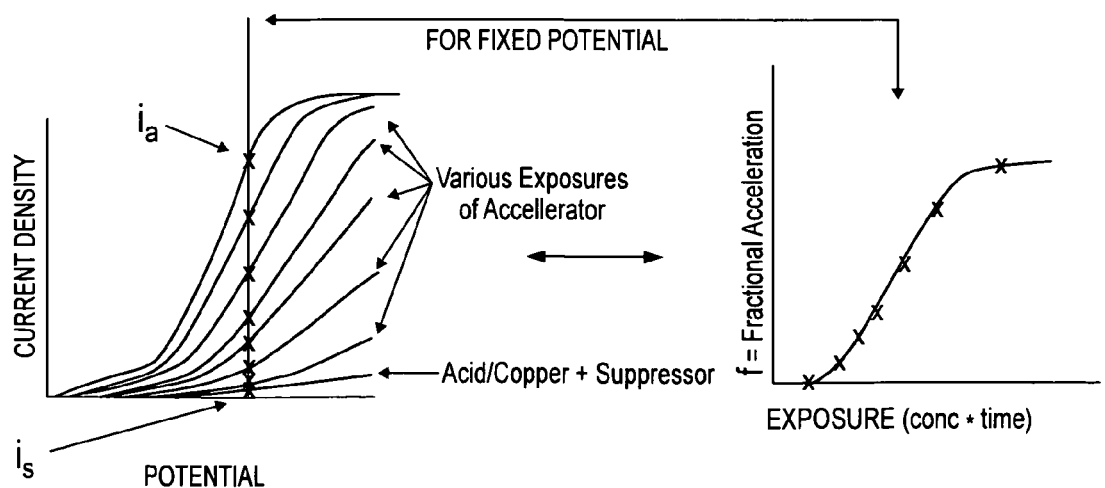
FIG. 16 depicts a graph showing the relationship between exposure to activating additive (in terms of concentration and time of exposure) and fractional acceleration, a dimensionless parameter indicating the degree of plating acceleration in comparison to complete suppression and complete acceleration.

From curves such as those shown in FIG. 15, one can construct a graph showing the relationship of fractional acceleration vs. accelerant exposure, FIG. 16, by plotting the dimensionless fractional acceleration f, $$f = \frac{i - i_s}{i_a - i_s}$$

as a function of exposure to accelerator. The variable i is the current at a given potential, and the terms $i_a$ and $i_s$ are the currents at the same potential after full-activation and no-activation exposure conditions, respectively. The maximum contrast in plating rate between non-activated (also referred to as suppressed) surface and a full-activation surface can also be calculated as a function of potential as $$C_{max} = \frac{i_a}{i_s}$$

Assuming complete removal of accelerator from exposed regions during the removal step of the process, this is the maximum achievable ratio of plating rates between acceleration regions (e.g., recessed features) and non-accelerated regions (e.g., field regions) and can be used to determine optimal operating points.

Processes causing selective concentration of accelerator species in a recessed region relative to the presence of accelerator in an adjacent field region are important in a method in accordance with the invention for generating a patterned copper wire or other metal wiring. As described above, these processes generally comprise selective removal of the accelerator chemicals/film from exposed "field" areas, while not removing the accelerator from a recessed region. Techniques in accordance with the invention for selective removal of accelerator film chemicals from a workpiece have been described in co-pending U.S. patent application Ser. No. 10/739,822.

While embodiments in accordance with the invention are not dependent on any particular removal mechanism, selective removal of the accelerating film typically involves any one or more of the following: incorporating or reacting accelerator material into/with the rubbing pad; buffing the workpiece surface while flowing a solvent with solutes over the surface, to facilitate dissolution of the accelerator into a flowing solvent; forming aggregates or particles from an accelerator film and mechanically removing them from the surface (e.g., rinsing them away); forcing accelerator film material to become incorporated into an underlying metal layer (thereby lowering the surface concentration of accelerator); mechanically removing the accelerator with an abrasive polishing slurry and pad (either incorporating the accelerator into the material of the slurry or pad or mechanically aiding its transfer to the solution), and striking the surface with grazing-angle high-energy particles, using the momentum of the particles to eject or sputter-off the accelerator. In some embodiments, it is desirable to perform a separate rinse operation after a rubbing pad or other element has been separated from the workpiece surface.

Mechanically-facilitated removal of the surface-adsorbed accelerator involves frictional work accomplished by the rubbing action between a friction creating pad and the workpiece. Processes that are effective in removing accelerator, but not an underlying metal seed layer (i.e., that have good accelerator to metal removal selectivity), enable over-rubbing, which ensures complete removal of accelerator from a field region. The process is therefore significantly insensitive to excess rubbing. The pad is moved relative to the workpiece while an applied (global or superficial) pressure of from 0.05 to 2 pounds per square inch is applied. The relative speed of motion between the surfaces is typically from 0.02 meter/sec to 2 meter/sec. The relative motion between the pad and the work-piece can be achieved using a number of different methods commonly known in the art of lens manufacturing and chemical mechanical polishing (CMP). These include orbital motion, linear motion, counter rotational, off axis counter rotational, and the like.

A rubbing pad typically comprises an organic polymer material, has relatively high compressive strength, and is superficially substantially non-compliant. This is important so that the pad does not remove adsorbed accelerator from the surface inside the low-aspect-ratio feature of the recessed region. In many cases, the pad is formed using a layered structure, wherein a relatively thin film of a more-compliant, micro-rough and porous polymer (suitable for creating high local pressures and wear) is mated with a rigid backing (ensuring that the pad will not dish into a feature bottom; e.g., into recessed region 210). The micro-roughness is typically provided by an air-blown film or the like, and can be periodically conditioned using a diamond reconditioning tool, as known in the art. Typical materials of construction of the working surface include polyurethane and polyfurfal alcohol (PFA). A suitable commercially-available pad is the IC 1000 pad, supplied by Rodel Corporation of Phoenix, Ariz.

Without certainty as to a particular theoretical mechanism by which an accelerator film is removed from a workpiece surface, it is believed that an important part of removal involves the combination of chemical and mechanical energy used to break an accelerator-metal bond (e.g., in a mercapto-based accelerator, the sulfur-metal bond). Factors that influence the rate and degree of selective removal include parameters such as shear rate, pressure, roughness, lubricating liquid solvent and solutes, pad chemical composition, pad affinity for (reactivity with) the accelerator, and initial concentration of accelerator on the pad surfaces and in the pad bulk.

EXAMPLE 2

Figure 17:
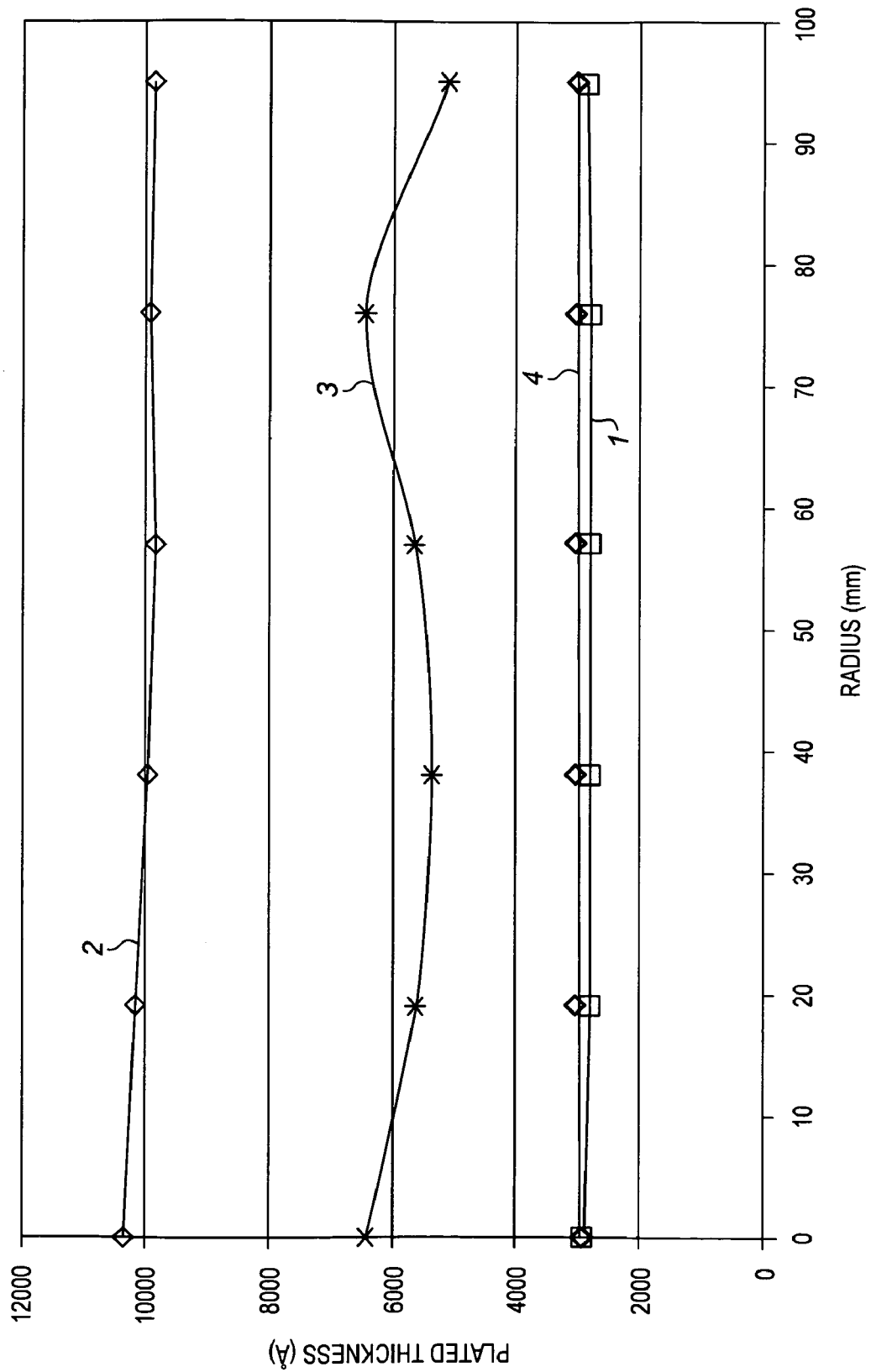
FIG. 17 depicts a graph showing the thickness profile of exemplary substrate wafers after various activation, rubbing, and plating processes.

A technique was developed that is useful in measuring the effectiveness and rate of accelerator film (adsorbate) removal. The technique involves comparing the electroplating response of accelerator-activated wafers, non-activated wafers, and wafers activated and rubbed (under various process conditions) in a plating bath. Non-featured 200 mm wafers containing a plasma vapor deposited (PVD) metal seed layer (125 nm Cu over 30 nm Ta) were used. A non-activated wafer was plated in a Novellus Systems SABRE™ plating tool, using a plating solution containing 35 g/L copper ion, 40 g/L sulfuric acid, 50 ppm chloride ion, and 0.2 g/L Pluronic L-62, and containing no accelerators or levelers. The wafer was plated for 300 seconds at constant potential (i.e., at 0.70 V relative to a $Hg/HgSO_4$ reference electrode). The reference electrode was ionically connected to the cell using the so-called Luggin-Haber capillary (see A. Bard and L. Faulkner, *Electrochemical Methods: Fundamentals and Applications*, John Wiley and Sons, Inc, New York, 1980, p. 24.). The current charge passed, and a map of the changes in sheet resistance (before and after plating, converted to net plated film thickness distribution) was recorded. Difference contour data were converted to radial averages, and plated thickness was plotted as a function of radius. Curve 1 in FIG. 17 shows a baseline profile of an untreated wafer plated in a suppressed bath. This was a suppressed-wafer baseline condition. The process was repeated again, except copper was plated onto an accelerator-activated wafer, yielding an activated-wafer baseline condition (curve 2, FIG. 17). The accelerator-activation process involved pre-wetting the wafer with a stream of DI water (300 rpm, 500 cc/min, 10 seconds), spraying the wafer with a solution of 1 g/L MPSA in water (300 rpm, 100 cc/min flow, for 10 seconds), followed by rinsing with DI water (300 rpm, 20 seconds), and finally spin drying (1500 rpm, 25 seconds). The wafer was then plated in the same manner as above, and the same data set was collected. This is the activated wafer baseline. Depending on the potential and other conditions chosen, the thickness of plated copper on the activated wafer was 2 to 15 times thicker than on the non-activated wafer. Increasing the concentration or exposure time of accelerator solution did not significantly change the wear-removal or electroplating behavior of the surface, indicating that the surface was saturated with MPSA. Finally, accelerator-activated wafers were placed in a Novellus Systems orbital polishing tool where buffing conditions such as average pressure, pressure distribution, orbital rotation rate, pad material, rubbing solution (lubricant) and time were varied. This created activated wafer surfaces and rubbed wafer surfaces. After rubbing, wafers were plated in the same plating solution under the same plating conditions as above. Curves 3 and 4 of FIG. 17 show the effect of buffing times (15 and 30 seconds, respectively) on the plating response using an IC1000 buffing pad and a buffing fluid/lubricant (of the same composition as the plating solution described above) at a flow rate of 200 ml/min.

For a given set of operating conditions, the rate of removal of attached accelerator film generally increases with shear rate (rotation rate) and applied pressure (i.e., removal rate is proportional to rate of work). However, too much applied pressure could lead to damage of the underlying device structures, particularly with current industrial trends to use mechanically weak, porous low-K dielectric materials in electronic devices. Therefore, it is desirable to use methods and materials to minimize the applied stress needed to remove the adsorbed accelerator, without substantially removing the underlying base metal. Use of excess force, non-optimal pads, poor lubricants and lubricant flow distribution may lead to unwanted excess and/or non-uniform removal of base seed metal or other underlying base material.

Use of the procedure described above to compare the effectiveness of accelerator removal showed that certain aqueous lubricant constituents affect accelerator removal. In general, an acidic solution should be slightly oxidizing (e.g, contain approximately a 2 ppm to 500 ppm concentration of an oxidizer such as oxygen, hydrogen peroxide, permanganate, or ozone) and contain a soluble or complexing metal salt (e.g., sulfate or citrate, respectively) at a pH at which the metal is at least marginally soluble (e.g., ~0.1 g/L copper ion). It is believed that the presence of the oxidizer weakens the accelerator-metal bond by shifting the metal potential to a more positive (anodic) value and may result in slight etching, allowing high regions to be removed and exposing low regions so that accelerator can be removed from them more effectively. In the case of MPSA, the surface probably becomes more positively charged under these oxidizing conditions, potentially weakening the mercapto-sulfur to copper bond. Of course, excess amounts of oxidizer would cause the underlying metal to corrode. Similarly, a strong specifically-adsorbing chloride ion is found to aid in the chemical/mechanical removal of the accelerator. A chloride-ion concentration of from 25 ppm to 1000 ppm is generally suitable. Finally, a chloride-activated suppressor (e.g., PEO/PPO type polymers, 0.05 to 0.5 g/L) is useful in obtaining the benefit of weakening the mercapto-metal bound, without the undesirable high metal-corrosion rate typically catalyzed by the presence of chloride ions. The suppressor also acts as a wetting agent/surfactant and a lubricant. As a specific example, an oxygen-saturated solution containing 40 g/L sulfuric acid, 30 g/L copper sulfate, 0.4 g/L Pluronic L-62, and 250 ppm chloride ion was found to be highly effective in selectively removing accelerator from activated wafers. Alternatively, more neutral lubricating solutions (e.g., pH-adjusted with tetramethylammonium hydroxide), containing a copper complexing agent such as citric acid or glycine, were also found effective in selective accelerator removal. It is believed the metal surface oxidizes (e.g., to cuprous oxide), which weakens the accelerator-metal bond and makes the surface layer more easily removable (along with the attached accelerator) by the mechanical action of the pad. Typically, concentrations of 0.4 to 4 g/L glycine are used; for example, higher concentrations of glycine (2 to 4 g/L) with low levels of oxidizer (e.g., saturated oxygen, with less than 1 g/L hydrogen peroxide), or less glycine (0 to 2 g/L) and a high concentration of hydrogen peroxide (10 to 100 g/L). As a specific example, a solution containing 0.5 g/L glycine and 15 g/L peroxide, flowing at a rate of 150 ml/min through a IC1000 pad with orbital radius of 16 mm and a rotation rate of 600 rpm, was highly effective in rapidly removing accelerator without significant unwanted removal of the metal seed layer.

Other mechanisms for selectively removing additive from the exposed surfaces of the field region include grazing-angle ion bombardment and grazing-angle laser ablation.

An electroplating solution generally contains a reducible ion (e.g., copper) to allow electroplating. A plating solution in accordance with the invention may be similar to conventional plating solutions, but preferably contains relatively little or no activating additive or brightener, making it unnecessary to remove that additive from the surface. Typically, a plating solution in accordance with the invention contains no more than about 10 ppm by weight of a chemically-activated accelerator (or a form of accelerator that is readily activated during electroplating). An electrolyte solution used in accordance with the invention typically is similar to those used in IC damascene copper electroplating (electrofill baths). For example, a typical copper electroplating solution comprises a copper sulfate/sulfuric acid solution, a PEO/PPO-type suppressor (see below), and chloride ions. Other bath chemistries may be employed for other types of electroplating. Because the plating bath contains relatively low concentrations of reactive accelerator, it will typically have a much longer useful lifetime than comparable conventional solutions that have relatively large quantities of such accelerator, reducing the need for bath additive concentration metrology.

A plating bath generally contains suppressor molecules with molecular weight from 500-10,000 (e.g., various linear and block polymers and copolymers of polyethylene and polypropylene oxides in the specified weight range). These "polarize" the electrochemical interface (i.e., increase the applied voltage necessary to obtain the same current with respect to a non-suppresor case). A small concentration of halide ions (e.g., chloride and/or bromide) is generally employed to facilitate the polarizing behavior of the suppressing molecules. While not wanting to be held to any specific model or theory, the halide ions are thought to form a physical bond or complex with the suppressor. Because the halide ion generally concentrates at a surface because of its specific adsorption characteristic, the polymer also concentrates there. This absorption of the suppressor onto the metal surface interferes with various physical and chemical kinetic processes related to the overall electrochemical deposition process, causing the surface to become significantly polarized.

The surface concentration of accelerator molecules should be greater in acceleration region 250 (FIGS. 9-11) than in field region 224 during the plating operation. In a method 100 as described above, this is accomplished by applying an accelerator solution globally to the workpiece surface in processes 160 of FIG. 1, selectively removing accelerator in processes 170, and then using a plating solution in processes 180 that contains little or no accelerator. In some embodiments in accordance with the invention, a single solution containing an electrochemically active precursor of accelerator compound is used for both global activation and plating. The single solution contains no accelerating compounds, but it does contain precursors of accelerating compounds that are activated only at a potential/current not encountered during electroplating. An accelerator film is formed from the solution using a first, high potential/current in processes such as processes 160; portions of the accelerator film are removed, as in processes 170; then, in processes such as processes 180, metal is electroplated from the solution using a second, lower-magnitude potential/current under which the accelerator precursor does not react to produce additional accelerator. Such embodiments have the disadvantage that significant amounts of metal may be plated in the field area simultaneously with the formation of the globally activated film, hence leading to the need to remove more field metal in subsequent processing.

PWB wiring, other metal structures and features in electronic devices, and methods and precursors for forming them in accordance with the invention are useful in a wide variety of circumstances and applications. For example, a method in accordance with the invention is useful for forming a metal structure in the acceleration region that serves as an interconnection between two parts of a microelectronic circuit, as a physical connection to a separate electronic assembly (e.g., a card edge connection), an electrode of a microfabricated capacitor, and an inductor, among others. It is evident that those skilled in the art may now make numerous uses and modifications of the specific embodiments described, without departing from the inventive concepts. It is also evident that the steps recited may, in some instances, be performed in a different order; or equivalent structures and processes may be substituted for the structures and processes described. Since certain changes may be made in the above systems and methods without departing from the scope of the invention, it is intended that all subject matter contained in the above description or shown in the accompanying drawings be interpreted as illustrative and not in a limiting sense. Consequently, the invention is to be construed as embracing each and every novel feature and novel combination of features present in or inherently possessed by the methods and structures described in the claims below and by their equivalents.

The invention claimed is:

1. A method of forming a metal structure in an electronic device, comprising processes of:
   applying a non-plateable layer to a workpiece;
   removing a first portion of said non-plateable layer to form a first plating region and a first non-plating region on said workpiece;
   then using first deposition processes to deposit metal onto said workpiece to form a raised field region in said first plating region and a recessed region in said first non-plating region;
   then globally applying an accelerator film on said workpiece;
   then selectively removing a portion of said accelerator film from at least a portion of said raised field region and not removing at least a portion of said accelerator film in said recessed region, thereby forming a non-activated region in said raised field region and an acceleration region in said recessed region; and
   then using second deposition processes to deposit metal on said workpiece, wherein said accelerator film in said acceleration region increases a rate of metal deposition in said acceleration region relative to a rate of metal deposition in said field region.

2. A method as in claim 1, further comprising processes of:
   removing at least a second portion of said non-plateable layer from said recessed region after said first deposition processes and before said applying said accelerator film.

3. A method as in claim 1 wherein said processes of applying said accelerator film comprise applying a portion of said accelerator film to a metallic surface in said recessed region.

4. A method as in claim 1, further comprising processes of:
   continuing depositing metal during said second deposition processes until an accelerated thickness of deposited metal in said acceleration region is at least 0.5 μm thicker than a field thickness of metal in said non-activated field region.

5. A method as in claim 1, further comprising processes of:
   removing metal completely from at least a portion of said field region after said second deposition processes of depositing metal.

6. A method as in claim 5 wherein said processes of removing metal from said field region form a metal structure having a structure width at least two times greater than a structure thickness.

7. A method as in claim 5 wherein said processes of removing metal from said field region comprise:
conducting a wet etch.

8. A method as in claim 1 wherein said processes of applying an accelerator film comprise applying a liquid accelerator solution containing accelerator species.

9. A method as in claim 8, wherein:
said second deposition processes to deposit metal are conducted using a plating solution, wherein said accelerator solution comprises a greater concentration of said accelerator species than said plating solution.

10. A method as in claim 8, wherein:
said accelerator solution comprises accelerator molecules selected from the group consisting of 2-mercaptoethane sulfonic acid (MESA), 3-mercapto-1-propane sulfonic acid (MPSA), mercaptopyruvate, 3-mercapto-2-butanol, 1-thioglycerol, dimercaptopropane sulfonic acid (DMPSA), dimercaptoethane sulfonic acid (DMESA), and salts thereof.

11. A method as in claim 8 further comprising processes of:
removing liquid accelerator solution from said workpiece, after said applying said liquid accelerator solution, without substantially removing said accelerator film from said workpiece.

12. A method as in claim 11 wherein said processes of removing liquid accelerator solution from said workpiece comprise rinsing said workpiece with liquid solvent, said liquid solvent having a lower concentration of accelerator species than a concentration of accelerator species in said liquid accelerator solution.

13. A method as in claim 12 wherein said processes of removing liquid accelerator solution from said workpiece comprise drying said workpiece.

14. A method as in claim 1 wherein said second deposition processes of depositing metal on said workpiece comprise continuing metal deposition to a desired thickness of metal in said acceleration region, and wherein during continued metal deposition, said accelerator in said acceleration region continues to cause a faster rate of metal deposition in said acceleration region relative to a rate of metal deposition in said non-activated field region.

15. A method as in claim 1 wherein said second deposition processes of depositing metal are conducted using a plating technique, and said plating technique comprises continued metal plating to a desired thickness of metal in said acceleration region, and wherein during continued metal plating, said accelerator in said acceleration region continues to cause a faster rate of metal plating in said acceleration region relative to a rate of metal plating in said non-activated region.

16. A method as in claim 1 wherein said processes of applying said accelerator film comprise applying accelerator species selected from the group consisting of 2-mercaptoethane sulfonic acid (MESA), 3-mercapto-1-propane sulfonic acid (MPSA), mercaptopyruvate, 3-mercapto-2-butanol, 1-thioglycerol, dimercaptopropane sulfonic acid (DMPSA), dimercaptoethane sulfonic acid (DMESA), and salts thereof.

17. A method as in claim 1 wherein said workpiece comprises a metal seed layer, and said processes of applying a non-plateable layer comprise applying said non-plateable layer to said metal seed layer.

18. A method as in claim 1 wherein said workpiece comprises a base layer, and further comprising processes of:
applying a metal seed layer to said base layer before applying said non-plateable layer to said workpiece.

19. A method as in claim 1 wherein said processes of applying on a non-plateable layer to said workpiece comprise processes of:
applying a photoresist layer to said workpiece.

20. A method as in claim 1 wherein said first deposition processes comprise depositing copper.

21. A method as in claim 1 wherein said first deposition processes comprise depositing a metal selected from the group consisting of Pt, Rh, Re, Au, Ag, Ir, Ni, W, Mo, Co and alloys thereof.

22. A method as in claim 1 wherein said second deposition processes comprise depositing copper.

23. A method as in claim 21 wherein said second deposition processes comprise electroplating copper.

24. A method as in claim 1 wherein said first deposition processes form a raised field region in said first plating region having a height at least about 25 nm higher than a bottom of said recessed region in said first non-plating region.

25. A method as in claim 1 wherein said recessed region has a width in a range of about from 2 μm to 5 mm.

26. A method as in claim 1 wherein said second deposition processes deposit metal in said acceleration region to a thickness in a range of about from 1 μm to 100 μm.

27. A method as in claim 1 wherein said forming said metal structure comprises forming in said acceleration region an interconnection between two parts of a microelectronic circuit.

28. A method as in claim 1 wherein said forming said metal structure comprises forming in said acceleration region part of a physical connection to a separate electronic assembly.

29. A method as in claim 1 wherein said forming said metal structure comprises forming in said acceleration region an electrode of a microfabricated capacitor.

30. A method as in claim 1 wherein said forming said metal structure comprises forming in said acceleration region an inductor.

31. A method as in claim 1 wherein said first plating region and said first non-plating region on said workpiece form substantially a negative pattern of said metal structure.

32. A method as in claim 1 wherein said forming said metal structure does not include forming a metal structure embedded in a dielectric layer.

* * * * *